US008923365B2

(12) United States Patent
Zoels et al.

(10) Patent No.: US 8,923,365 B2
(45) Date of Patent: Dec. 30, 2014

(54) CONVERTER COMMUNICATION METHOD AND APPARATUS

(75) Inventors: Thomas Alois Zoels, Bayern (DE); Henry Todd Young, Erie, PA (US); Alvaro Jorge Mari Curbelo, Bavaria (DE); Miguel Garcia Clemente, Bayern (DE)

(73) Assignee: General Electric Company, Schenectady, NY (US)

( * ) Notice: Subject to any disclaimer, the term of this patent is extended or adjusted under 35 U.S.C. 154(b) by 225 days.

(21) Appl. No.: 13/470,973

(22) Filed: May 14, 2012

(65) Prior Publication Data

US 2013/0301755 A1    Nov. 14, 2013

(51) Int. Cl.
*H04B 1/38* (2006.01)

(52) U.S. Cl.
USPC .......................... 375/219; 375/296; 375/316

(58) Field of Classification Search
USPC ............ 375/219, 296, 316; 363/132, 284, 98, 363/16; 327/434, 448
See application file for complete search history.

(56) References Cited

U.S. PATENT DOCUMENTS

| 5,900,683 | A | 5/1999 | Rinehart et al. |
| 2009/0052211 | A1* | 2/2009 | Asai ........................... 363/56.05 |
| 2011/0188218 | A1* | 8/2011 | Hsing et al. .................... 361/772 |
| 2013/0082602 | A1* | 4/2013 | Bradford ....................... 315/122 |

FOREIGN PATENT DOCUMENTS

| DE | 102005045957 A1 | 11/2006 |
| EP | 1357461 A2 | 10/2003 |
| EP | 2302795 A1 | 3/2011 |

OTHER PUBLICATIONS

Young-Min Park, et al; Practical Implementation of PWM Synchronization and Phase-Shift Method for Cascaded H-Bridge Multilevel Inverters Based on a Standard Serial Communication Protocol; IEEE Transactions on Industry Applications, vol. 44, No. 2, Mar./Apr. 2008.

Search Report and Written Opinion from corresponding PCT Application No. PCT/US2013/036061 dated Oct. 9, 2013.

* cited by examiner

*Primary Examiner* — Zewdu Kassa
(74) *Attorney, Agent, or Firm* — GE Global Patent Operation; John A. Kramer

(57) ABSTRACT

A communication method includes detecting at a gate drive unit a change of state of a command signal that is received via a command link of the gate drive unit and initiating, responsive to the change of state of the command signal, a blanking period in which the gate drive unit will process as incoming data any further changes of state of the command signal. The method also includes receiving incoming data at the gate drive unit, by processing modulations of the command signal, within the blanking period.

29 Claims, 6 Drawing Sheets

CONVERTER COMMUNICATION METHOD AND APPARATUS

BACKGROUND

1. Technical Field

Embodiments of the invention relate generally to electric power converters. Other embodiments relate to communication protocols for electric power converters.

2. Discussion of Art

Trains typically feature a number of cars that are pushed or pulled by a locomotive. The locomotive has traction wheels engaged with the track. In modern designs, electric wheel motors drive the traction wheels. The electric wheel motors are powered via electrical distribution from one or more engine-driven generators housed within the locomotive. The traction wheels and wheel motors can be reversibly configured, to also act as brakes for slowing the locomotive.

Similarly, in the mining industry, large off-highway vehicles ("OHVs") usually employ electrically motorized wheels for propelling or retarding the vehicle. In particular, OHVs typically include a large horsepower diesel engine in conjunction with an alternator, a main traction inverter, and a pair of wheel drive assemblies housed within the rear tires of the vehicle. The diesel engine is directly associated with the alternator such that the diesel engine drives the alternator. The alternator powers the main traction inverter, in which semiconductor power switches commutate the alternator output current to provide electrical power to electric drive motors of the two wheel drive assemblies.

In both locomotive and OHV applications, solid state power converters (e.g., the aforementioned traction inverter) are used to provide high voltage current from the generators or alternators to the wheel motors. Such power converters include inductive coils to step down the voltage as well as semiconductor power switches to commutate the current. Although the above-described applications are typical, it will be appreciated that power converters can be used in many other settings.

Generally, operation of a power converter is accomplished by applying alternately two different gate voltage levels (e.g., an "off" voltage and an "on"/drive voltage) to individual semiconductor power switches via corresponding gate drive units. It is a known problem that semiconductor power switches respond differently to gate voltages, depending on electrical parameters of the circuit in which the power switches are connected. Thus, power converter efficiency varies across the operating ranges of electrical parameters that impact semiconductor power switch response.

Therefore, it is desirable to monitor electrical parameters during operation of a power converter and adapt to such parameters to increase converter efficiency.

BRIEF DESCRIPTION

According to one embodiment of the present invention, a communication method comprises detecting at a gate drive unit a change of state of a command signal that is received via a command link of the gate drive unit. (The gate drive unit may be configured, for example, to drive a semiconductor power switch in a power converter.) The method further comprises initiating, responsive to the change of state of the command signal, a blanking period in which the gate drive unit will process as incoming data any further changes of state of the command signal. The method further comprises receiving incoming data at the gate drive unit, by processing modulations of the command signal, within the blanking period.

According to another embodiment of the present invention, a power switch apparatus includes a semiconductor power switch, a gate drive unit connected to the semiconductor power switch, and a command link connecting the gate drive unit in communication with a controller. The gate drive unit is configured to receive a command signal from the controller via the command link, and to detect a change of state of the command signal. The gate drive unit is further configured to initiate, responsive to the change of state of the command signal, a blanking period in which the gate drive unit will process as incoming data at least one further change of state of the command signal, and to receive incoming data via the command link, within the blanking period.

According to yet another embodiment of the present invention, a power converter includes a plurality of semiconductor power switches and a plurality of gate drive units. Each gate drive unit is connected to deliver gate voltage to one of the plurality of semiconductor power switches. Each gate drive unit includes a command link for connecting that gate drive unit in communication with a controller. Each gate drive unit is configured to receive a command signal from the controller via the command link. At least one gate drive unit is configured to detect a change of state of the command signal, to initiate a blanking period responsive to the change of state of the command signal, and, within the blanking period, to process as incoming data any further changes of state of the command signal.

DRAWINGS

The present invention will be better understood from reading the following description of non-limiting embodiments, with reference to the attached drawings, wherein below:

DETAILED DESCRIPTION

Figure 1:
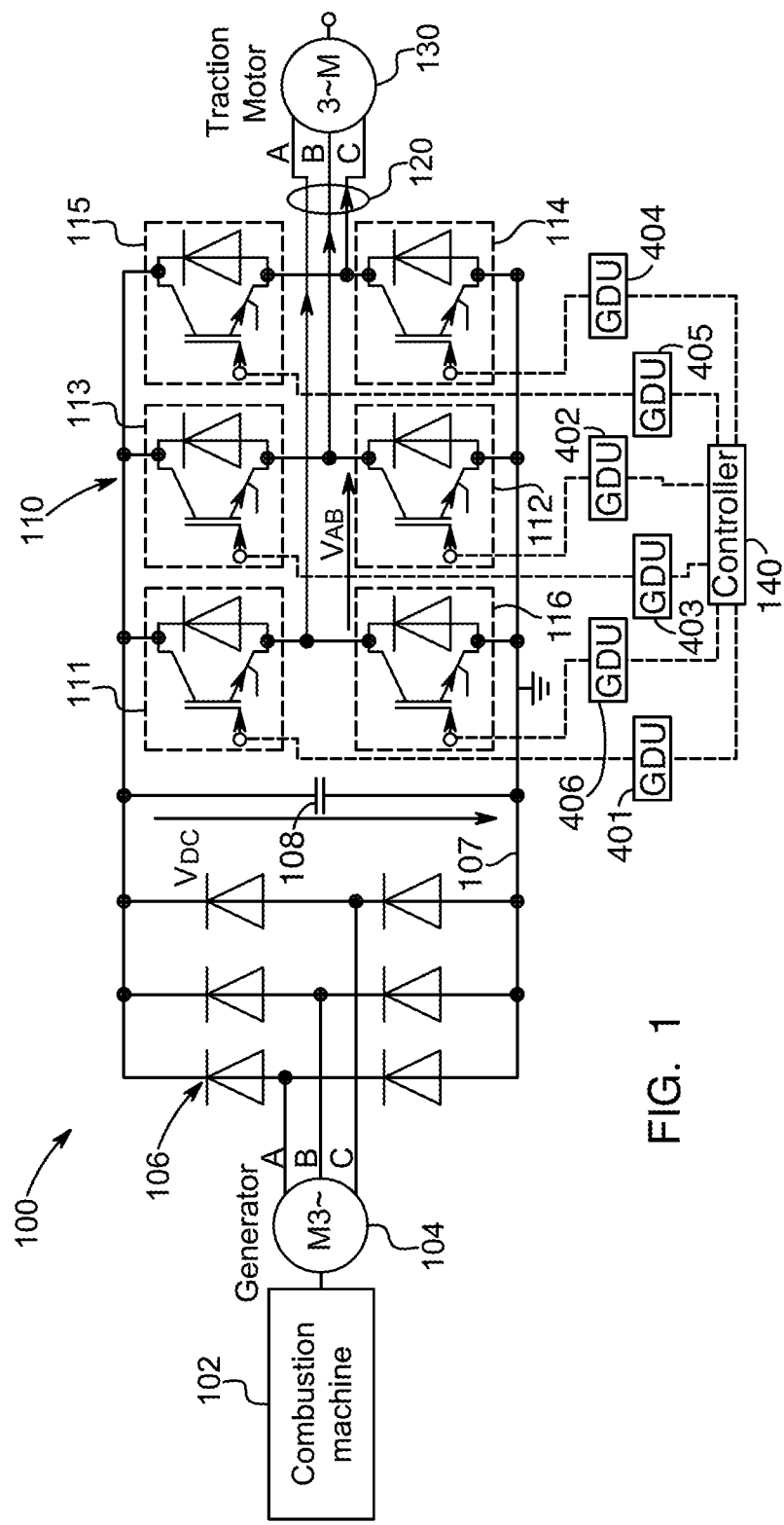
FIG. 1 is a schematic view of a diesel-electric traction system including a three-phase semiconductor power converter, which can be controlled by gate drive units according to an embodiment of the present invention.

Reference will be made below in detail to exemplary embodiments of the invention, examples of which are illustrated in the accompanying drawings. Wherever possible, the same reference characters used throughout the drawings refer to the same or like parts. Although exemplary embodiments of the present invention are described with respect to power converters, embodiments of the invention are also applicable for use with semiconductor power switches generally, meaning any solid state device suitable for switching current to power a load.

FIG. 1 is a schematic view of a diesel-electric traction system 100 that may be used with embodiments of the present invention. As shown, a combustion machine 102 drives a three-phase generator 104. AC voltage produced by the generator 104 is rectified by a three-phase diode array 106, which delivers voltage Vdc to a DC link 107 connected across a capacitor 108 and a power inverter 110. The power inverter includes switch apparatus 111, 112, 113, 114, 115, 116, also referred to herein as switch "modules," which together commutate Vdc to deliver three-phase electrical power via output leads 120 to a traction motor 130. According to one aspect of the present invention, each switch module is controlled and monitored by an associated gate drive unit 401, 402, 403, 404, 405, 406, as further discussed below with reference to FIG. 4. The gate drive units are coordinated by a central controller 140.

Figure 2:
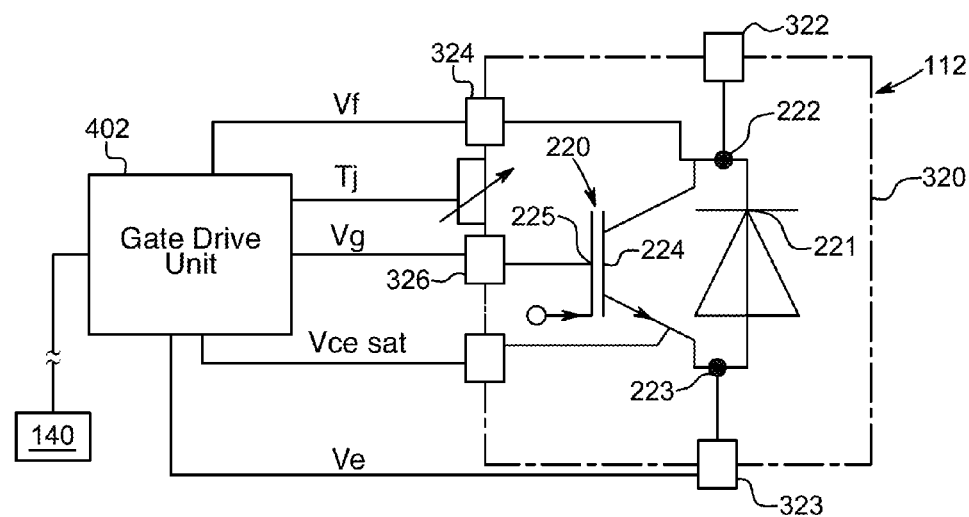
FIG. 2 is a schematic view of a switch apparatus of the power converter shown in FIG. 1, including a semiconductor power switch and a free wheel diode.
Figure 3:
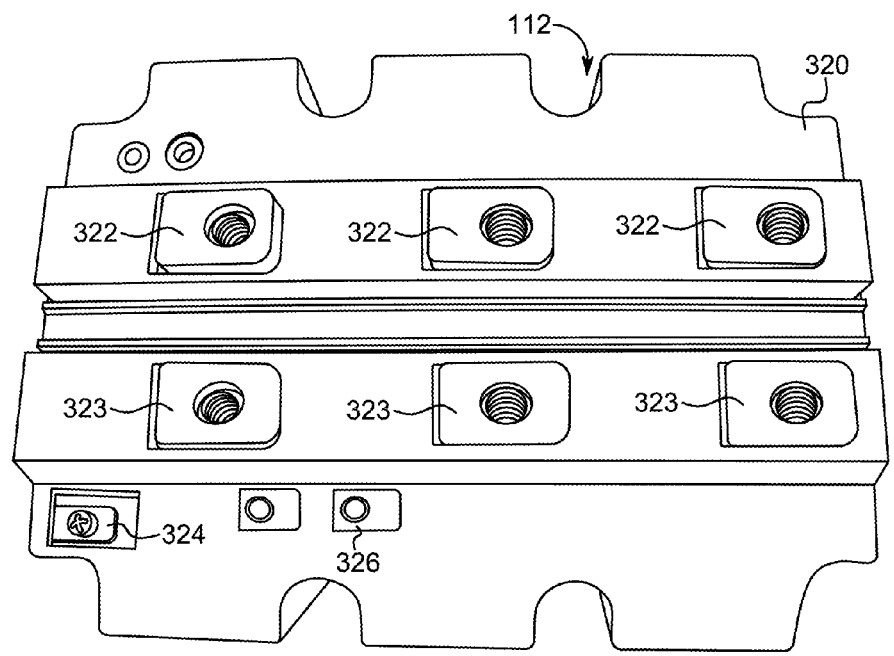
FIG. 3 is a perspective view of an exterior of the switch apparatus shown in FIG. 2.

FIG. 2 shows in schematic view the switch apparatus 112, while FIG. 3 shows in perspective view an embodiment of a case 320 of the switch apparatus 112. As shown in FIG. 2, the switch apparatus 112 includes within its case 320 a semiconductor power switch 220 and a free wheel diode 221. The semiconductor power switch 220 has a collector 222 and an emitter 223 that are joined by a junction 224. At the junction 224, a gate 225 is connected to receive gate voltage Vg and gate current Ige from an associated gate drive unit 402. The free wheel diode 221 is connected anti-parallel to the semiconductor power switch 220, in other words, the anode of the free wheel diode is connected to the semiconductor power switch emitter 223 while the cathode of the free wheel diode is connected to the semiconductor collector 222.

The collector 222 is connected to one of the output leads 120 and to an electrically adjacent switch apparatus 113, via a collector terminal 322 included in the switch apparatus case 320. The emitter 223 is connected to the DC link 107 at the low side of the capacitor 108 and of the rectifier 106, via an emitter terminal 323 included in the switch apparatus case 320. The gate drive unit 402 is connected to the semiconductor power switch gate 225 via a control terminal 326.

Although FIG. 2 specifically illustrates an exemplary embodiment wherein the semiconductor power switch is an isolated gate bipolar transistor (IGBT), the present invention is also applicable to other solid state semiconductor devices, including, by way of non-limiting examples, bi-mode isolated gate power transistors (BiGTs), MOSFETs and other JFETs. Although FIG. 2 shows only a single semiconductor power switch 220 and a single free wheel diode 221, in other embodiments, multiple power switches and diodes may be housed within a single switch apparatus.

For optimal utilization and safe operation of the power converter 110, in embodiments, operation of the individual semiconductor power switches 220 is adjusted according to changes in operating parameters of the power converter. For example, in embodiments, the current slew rate during "switch ON" (activation) of an individual power switch is adjusted. In aspects of the present invention, such adjustment is achieved via communication between the central controller 140 and each gate drive unit 401, etc.

Figure 4:
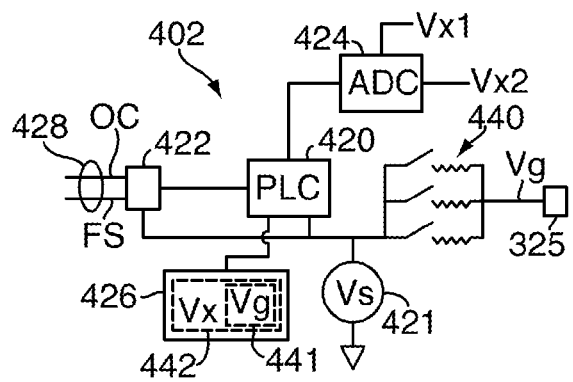
FIG. 4 is a schematic view of a gate drive unit, connected with the switch apparatus shown in FIG. 2, according to an embodiment of the present invention.

Accordingly, FIG. 4 shows in schematic view a gate drive unit 402, connected with the switch apparatus 112, according to an embodiment of the present invention. The gate drive unit 402 includes a programmable logic controller (PLC) 420, which in one embodiment can be an FPGA (field programmable gate array). (In other embodiments, the controller 420 is another type of controller.) The gate drive unit 402 also includes a DC power supply 421, a command link connector 422, a memory 426, and several signal connections. In particular, the command link connector 422 is connected with the central controller 140 via a command link 428. Through the command link 428 and the command link connector 422, the central controller 140 can provide to the PLC 420 a command (operator control) signal OC.

The memory 426 may be "non-volatile," in other words, maintains stored data when the gate drive unit 402 is not supplied with power. In other embodiments, the memory 426 is "volatile," i.e., it maintains stored data only while the gate drive unit 402 is supplied with power.

In certain embodiments, typically for use with high-voltage (>1200 V) semiconductor power switches, the command link 428 is a paired optical fiber and the command link connector 422 is a two-channel optical converter. The command link connector 422 may also be configured for use with a bi-directional (single fiber) command link. In yet other embodiments, typically for use with low-voltage (<1200 V) semiconductor power switches, the command link connector may be an electrical connector such as, for example: one or more screw plates; a coaxial plug; a USB socket; an RJ-45 jack; an RJ-25, RJ-14, or RJ-11 jack; or the like. The command link connector may also be a wireless (radio or near-field effect) receiver or transceiver, while the command link may be wireless over-the-air.

Referring still to FIG. 4, in response to the command signal OC, the PLC 420 adjusts an output stage 440 so as to deliver a gate drive voltage Vg to the semiconductor power switch, via the control terminal 326. (Gate drive voltage refers to a voltage for activating the power switch to deliver current to a load.) The PLC 420 selects one of a plurality of pre-determined values or setpoints 441 (for the gate drive voltage) that are stored in a lookup table 442 within the memory 426, and adjusts the output stage 440 to match Vg to the setpoint. In certain aspects of the invention, the pre-determined setpoints 441 include time sequenced arrays or time functions, each corresponding to one of a plurality of reference values.

Optionally, the gate drive unit includes an ADC (analog-digital converter) 424. The ADC 424 gathers various measured values Vx1, Vx2 . . . Vxn, which are related to the semiconductor power switch 220 that is driven by the gate drive unit 402. The PLC 420 stores the measured values in the memory 426, pending transmission of this gathered data to the central controller 140. According to aspects of the invention, the measured values Vxn that are related to the semiconductor power switch 220 can be reported from the gate drive unit 402 back to the central controller 140, via the PLC 420 and the command link 428.

Figure 5:
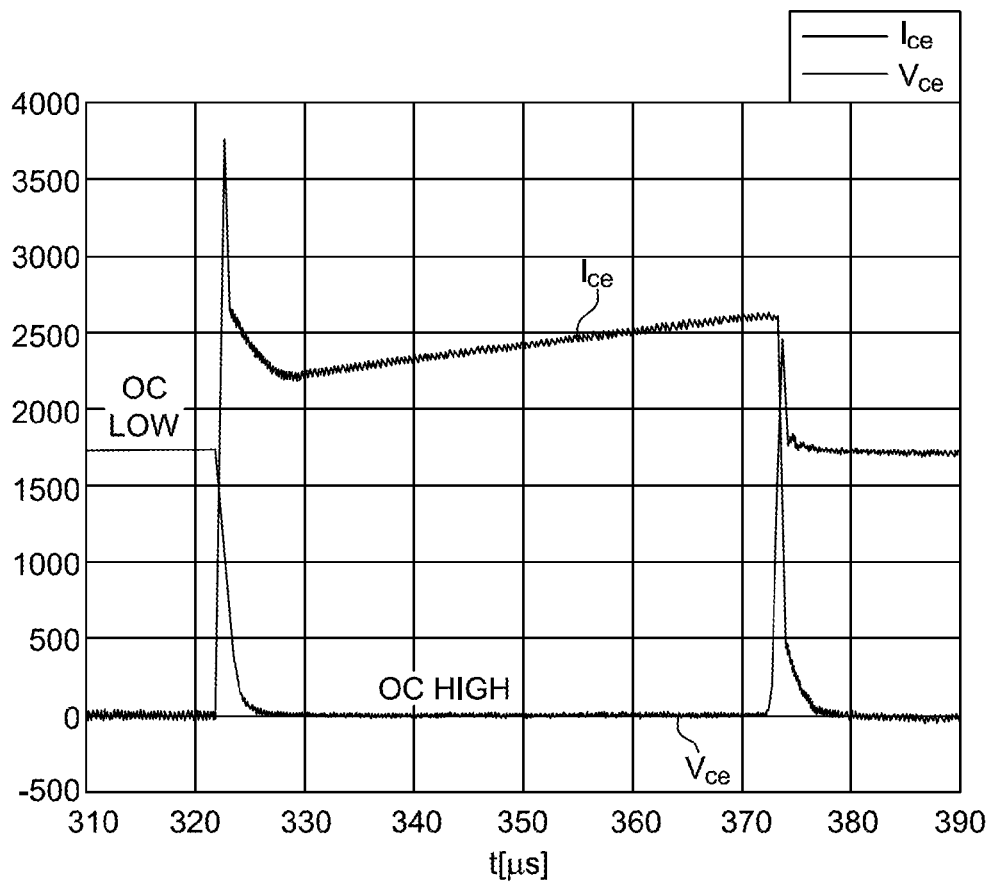
FIG. 5 shows waveform graphs of power transients for a semiconductor power switch switched by a conventional gate drive unit.

The preceding discussion of control and data signal transmissions, via the command link 428, however, overlooks a deficiency of conventional gate drive units. Namely, they are not designed to send, receive, or transfer data, but only to provide gate voltage to a semiconductor power switch in response to an ON or OFF signal. In this regard, FIG. 5 illustrates typical operation of a conventional "normally OFF" gate drive unit and semiconductor power switch. Specifically, FIG. 5 shows that the gate drive unit sends a positive gate voltage Vg_on while receiving a HIGH state of the command signal OC, and sends a negative gate voltage Vg_off while receiving a LOW state of the command signal OC. In response, the semiconductor power switch, biased by the gate drive unit, exhibits typical transients of through voltage Vice and power current Ice. Other conventional gate drive units (not shown) are "normally ON." Conventional gate drive units also toggle state on receipt of a specific duration HIGH pulse of a command signal OC, and maintain steady state during a LOW state of the command signal OC. In such designs, there is no provision for processing signals other than switching commands. However, it is typical for a gate drive unit to send a feedback signal FS acknowledging a change in state of the command signal OC, or reporting a change in state of the gate drive unit.

Digital data sent via a command link to a conventional gate drive unit, configured to process changes of state in a command signal by changing state as shown in FIG. 5, could cause rapid switching of the semiconductor power switch controlled by that gate drive unit, with concomitant electrical transients, thermal stresses, and overall detrimental effects on system longevity. Accordingly, in embodiments, a pre-determined "blanking period" (of a predetermined amount of time) is imposed following of change of state of the command signal OC. During the finite blanking period, the gate drive unit will maintain a steady state as set by the initial change of the command signal OC, and will process further changes in state of the command signal. "Process" includes detecting the further change of state, and acting responsive to the change of state in a manner that the gate drive unit would not act if the blanking period was not in effect. For example, during the blanking period, the gate drive unit may detect a change of state that ordinarily would cause activation or deactivation of the power switch for delivering current to a load. Instead of activating or deactivating the power switch in response to the change of state, during the blanking period, the gate drive unit will process modulation of the command signal as communication data.

Figure 6:
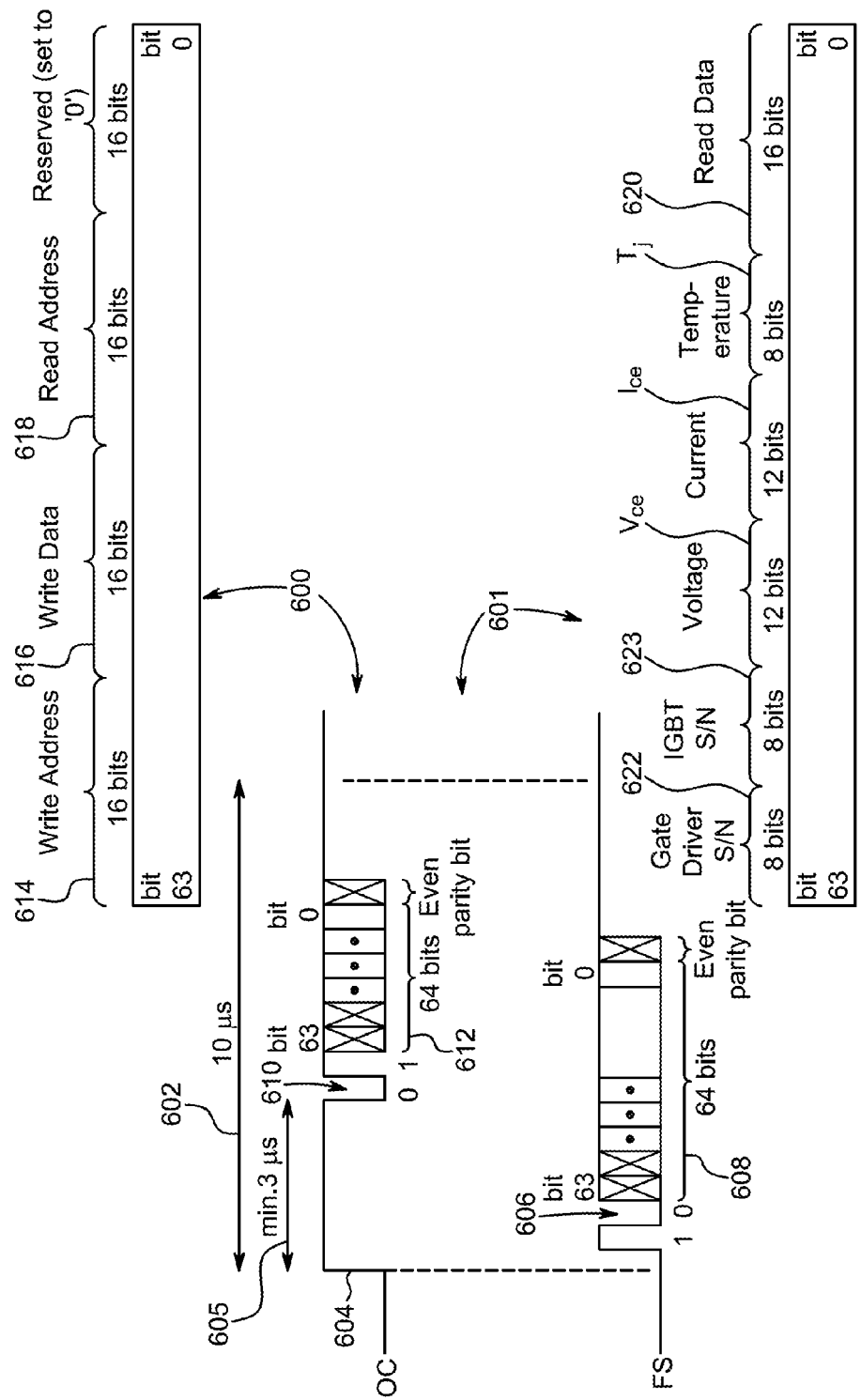
FIG. 6 shows in schematic view signal formats usable in a first two-way communication protocol, according to an embodiment of the present invention.
Figure 7:
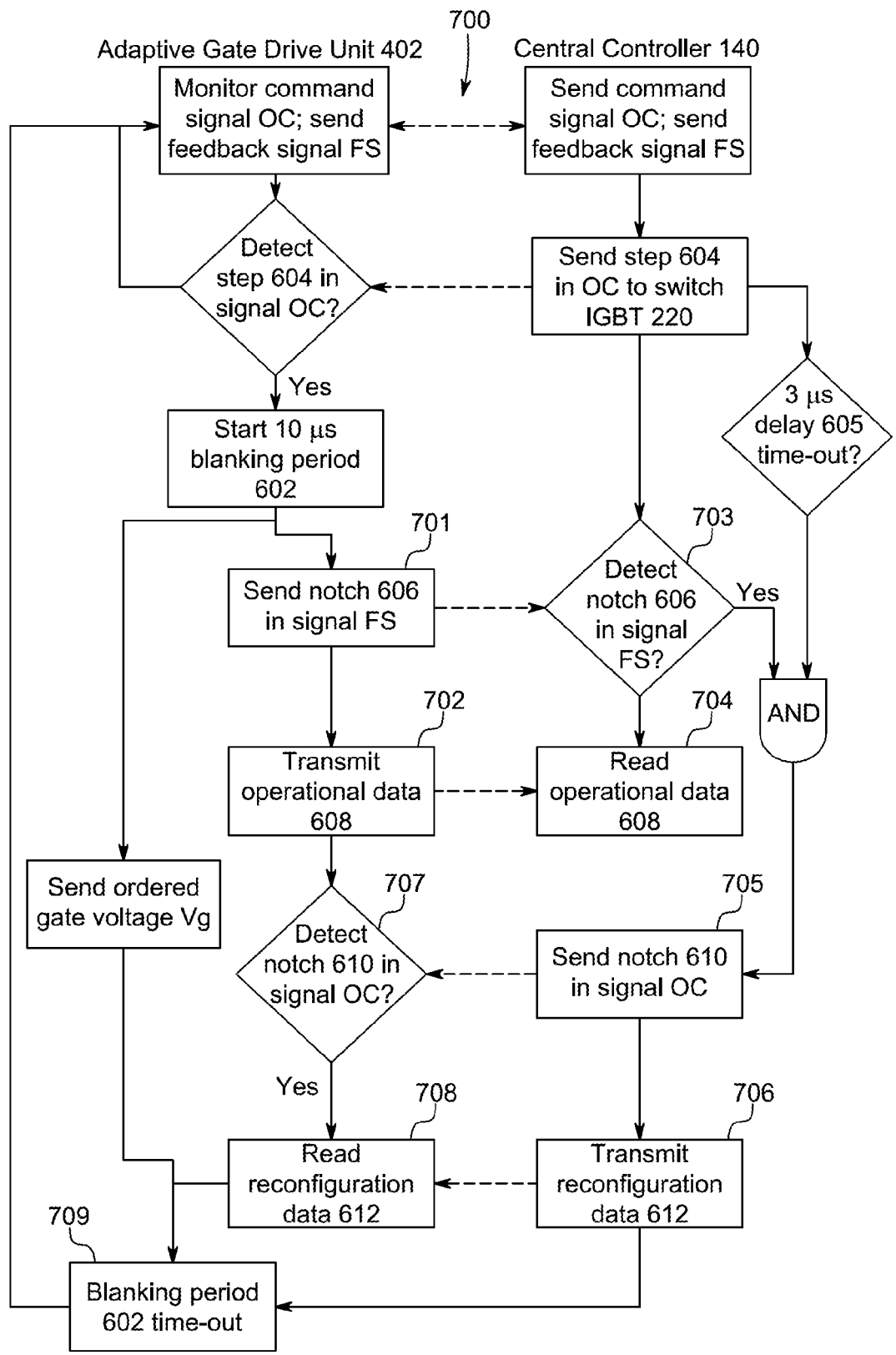
FIG. 7 is a flowchart of a communication protocol for the coordinating signal formats shown in FIG. 6, according to an embodiment of the invention.

According to embodiments of the invention, data transfer to and from a gate drive unit is provided using signal formats and a communication protocol as shown in FIGS. 6 and 7. FIG. 6 shows a format 600 for data transfer from the central controller 140 to the gate drive unit 402, using the command signal OC as a carrier. FIG. 6 also shows a format 601 for data transfer from the gate drive unit to the central controller 140, using a feedback signal FS as a carrier. In FIG. 6, the abbreviation "S/N" refers to a serial number or other identifier, which may be unique to each unit or may be common across a specific model or embodiment of the invention.

In embodiments, the signal formats 600, 601 are designed to fit within a 10 μs (ten micro-second) blanking period 602 in which the gate drive unit will maintain steady state (constant gate voltage Vg) without regard to changes of state of the command signal OC. Such a blanking period might, by way of example, last for about 10 μs following a "step change" of state 604 in the command signal OC. In certain embodiments, a "step change" may be described as being a change greater than a specific fraction of the difference between design HIGH and LOW voltage levels, within a period of about 1 μs (micro-second). In specific embodiments, a "step change" may be more than about sixty percent (60%) of the difference from HIGH to LOW. Generally, a "step change" is a change in signal that can be distinguished from the expected noise value, and may include changes between several pre-defined signal levels. Therefore, even where the command signal OC is abnormally noisy, at worst case, a gate drive unit configured for a blanking period will switch no more than once in 10 μs.

According to an aspect of the invention, blanking periods are used for exchange of data other than switching commands. For doing so, the gate drive unit 402 is configured to send and receive data according to a communications protocol that is designed to fit within the designated blanking period.

FIG. 7 shows in flowchart form an exemplary communications protocol 700, which can be initiated by the central controller 140 sending the "step change" 604 in the command signal OC. At a step 701, the gate drive unit 402 can continue the communication protocol 700 by sending back to the central controller 140 a "notch" 606, which is a brief inversion (HIGH-to-LOW-to-HIGH, or LOW-to-HIGH-to-LOW) of feedback signal FS. The notch 606 indicates to the central controller 140 that two-way data transmission will be enabled by the gate drive unit 402 within the blanking period following the step change of the command signal OC. Immediately after sending the notch 606, the gate drive unit 402 sends operational data 608 at a step 702.

In the embodiment shown in FIG. 6, the operational data 608 includes a gate drive serial number, a semiconductor power switch serial number, a power switch voltage drop Vice, a power switch current Ice, and at least one of a switch apparatus case temperature Tc or an estimated power switch junction temperature. The gate drive serial number and the semiconductor power switch serial number can be used at a central controller (not shown) for determining appropriate values of, for example, the Vg setpoints 441.

During a delay 605, which starts when the "step change" 604 is inserted into the command signal OC, the central controller 140 executes method step 703 of checking the feedback signal FS for the notch 606. In certain embodiments, as shown in FIG. 6, the delay may be about three (3) μs duration. In case the notch 606 is detected, then at method step 704 the central controller 140 immediately begins to read the operational data 608 sent by the gate drive unit 402. At the end of the delay 605, the central controller 140 at method step 705 sends to the gate drive unit 402 an acknowledging notch 610, followed by sending reconfiguration data 612 at a method step 706. The gate drive unit executes parallel method step 707 of receiving the notch and then receives the reconfiguration data at a method step 708. For example, the reconfiguration data 612 can include an updated target value of gate voltage Vg, as well as updated threshold values of select operational parameters used for health monitoring purposes.

As shown in FIG. 6, the protocol 700 provides for transmission of reconfiguration data 612 from the central controller 140 to the gate drive unit 402, via modulation of the command signal OC within the blanking period 602. For example, the signal format 601 provides for transmitting a write address 614 of an operational parameter to be adjusted (e.g., an address in the gate drive unit memory 426 that stores an ordered level of gate voltage Vg), as well as a new value 616 for adjusting the operational parameter. This permits in-operation re-programming of the gate drive unit 402 as a field change or the like, based on receipt, handling, and storage of the incoming reconfiguration data 612. As one example, the write address 614 may correspond to one of the plurality of setpoints 441 as discussed above with reference to FIG. 4, while the new value 616 may adjust that setpoint in response to operating parameters of the power converter 100. As another example, the write address 614 may correspond to the duration of the blanking period 602, and the new value 616 may adjust that duration.

In certain embodiments, the write address 614 and the new value 616 may cause the gate drive unit 402 to extend the duration of the blanking period 602 to permit for "bulk data" transmission. "Bulk data" is meant to describe packets of data that exceed the exemplary signal formats 600, 601 such as switch commissioning data or startup data. Thus, "bulk data" requires continuous data transmission, without change of the gate voltage level, for a time period that significantly exceeds the default duration of the blanking period 602. Thus, in cases where a blanking period is 10 μs, a bulk data transmission requires more than 10 μs. For example, in some aspects, a bulk data transmission requires the blanking period 602 to be reset to more than 20 µs. In selected aspects, a bulk data transmission requires the blanking period 602 to be reset to more than 50 µs. Thus, bulk data transmission should only take place under special conditions where the gate drive unit can be held ON or OFF for an arbitrary time period, for example, during commissioning, startup, or maintenance of the gate drive unit or of the power converter. A "bulk data" packet typically will end with a write address 614 and a new value 616 that resets the blanking period 602 to its default (operating) duration. Nonetheless, at method step 709 the blanking period will time out.

Additionally, the protocol 700 provides for random read access to operational data 608 of the gate drive unit 402. For example, the exemplary structure 601 for command signal OC provides for transmitting a read address 618 (corresponding to a storage location of a specific measured value within the gate drive unit memory 426), in response to which the gate drive unit 402 may, at step change 604 of the command signal OC, send the measured value to the central controller 140 as read data 620.

Inclusion within data structure 601 of gate drive unit serial number 622 and of semiconductor power switch serial number 623 permits the central controller 140 to authenticate power converter components, so as to assure reliable response to the command signal OC by the power converter 110. Meanwhile, the through voltage and current Vice, Ice, along with the semiconductor power switch junction temperature Tj, enable the central controller 140 to calculate and send reconfiguration data 612 for setting the gate drive unit 402 to provide appropriate gate drive voltage Vg.

Figure 8:
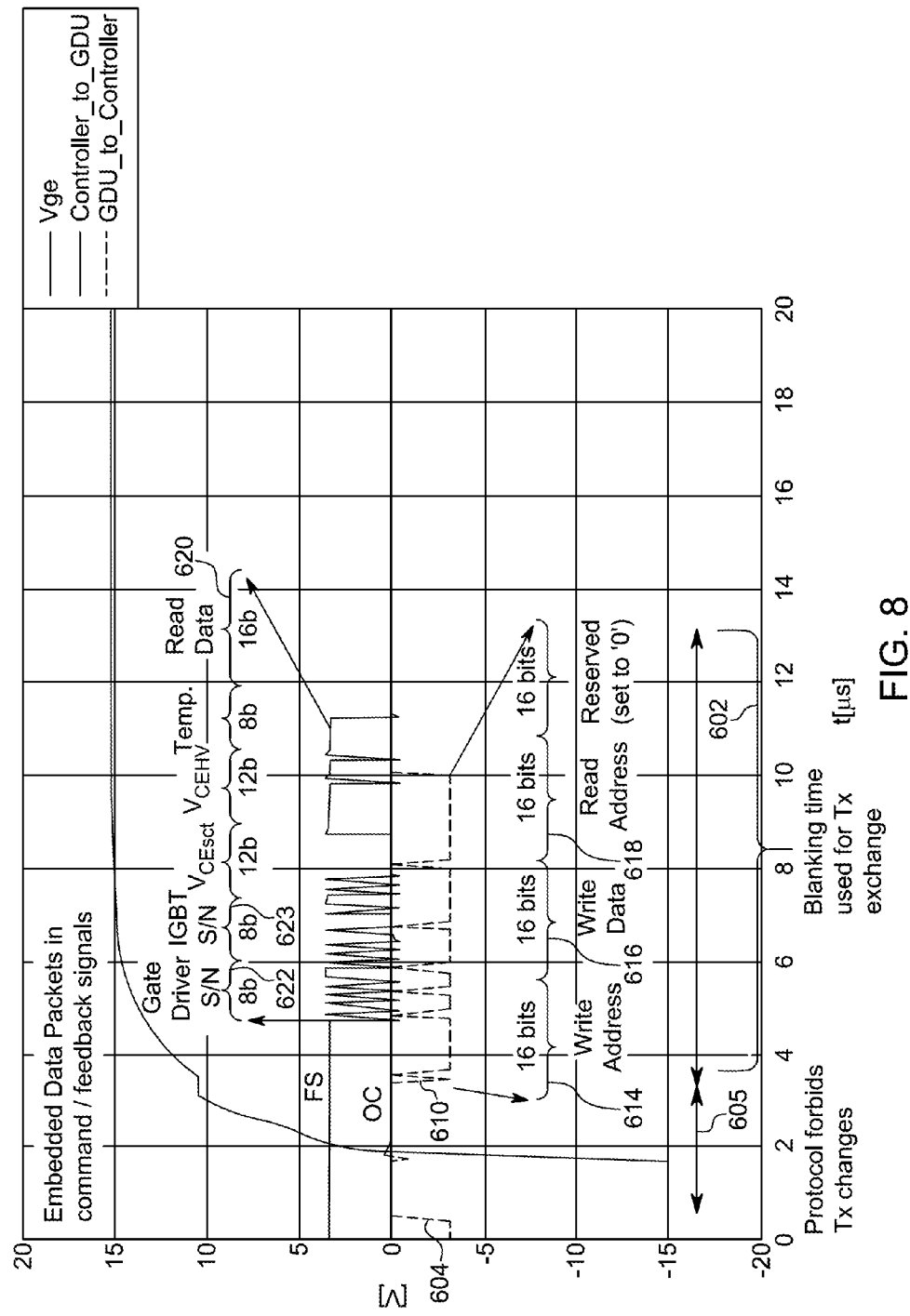
FIG. 8 is a graph of command and data signals to and from a gate drive unit in a two-way communication protocol, according to another embodiment of the present invention.

FIG. 8 illustrates waveforms of command signal OC and of gate drive unit feedback signal FS for an alternate embodiment of the invention, wherein, in a variation of the communications protocol 700, the gate drive unit 402 does not transmit until well after the 3 µs delay 605. Labels in FIG. 8 such as "8b", "12b", refer to numbers of data bits. The gate drive unit 402 is configured to expect data bits at a specific periodicity, e.g., in some embodiments, at a periodicity of one bit each µs (approximately 1 Mbs). Also, in FIG. 8, the label "S/N" refers to a gate drive unit serial number or other identifier; while the abbreviation "Tx" refers to transmission of data between a gate drive unit and a discrete controller. The labels VCEsct and VCEHV respectively refer to stored measurements of conducting and nonconducting collector-to-emitter voltages across the switch(es) driven by the gate drive unit.

Thus, in one embodiment, communication to a gate drive unit is accomplished, via a command link of the gate drive unit, by detecting at the gate drive unit a change of state of a command signal that is received via the command link. Responsive to the change of state of the command signal, the gate drive unit initiates a blanking period in which the gate drive unit will process as incoming data any further changes of state of the command signal. Thus, within the blanking period, the gate drive unit can receive incoming data via modulation of the command signal. In embodiments, communication is accomplished by also transmitting outgoing data from the gate drive unit via the command link, within the blanking period, by modulation of a feedback signal. In selected embodiments, the outgoing data is prepared by storing measured values in a memory. The outgoing data may, for example, include data identifying the gate drive unit. In some embodiments, the outgoing data may include periodic health monitoring and/or switch status data. In certain aspects, the incoming data may include a read address for operational data to be included in the outgoing data. The incoming data also may include a write address for updating an operational parameter of the gate drive unit. For example, the incoming data may include an updated setpoint of gate voltage. As another example, the incoming data may include an updated value for a duration of the blanking period. In some embodiments, the incoming data may include an expected value of data identifying the gate drive unit. In certain embodiments, the incoming data may include "bulk data."

In an embodiment, a power switch apparatus includes a semiconductor power switch, a gate drive unit connected to the semiconductor power switch, and a command link connecting the gate drive unit in communication with a controller. The gate drive unit is configured to receive a command signal from the controller via the command link, to detect a change of state of the command signal, to initiate, responsive to the change of state of the command signal, a blanking period in which the gate drive unit will process as incoming data at least one further change of state of the command signal, and to receive incoming data via the command link, within the blanking period. In embodiments, communication is accomplished by also transmitting outgoing data from the gate drive unit via the command link, within the blanking period, by modulation of a feedback signal. Selected embodiments of the power switch apparatus further include a sensor apparatus configured to measure a value of at least one characteristic of the semiconductor power switch. In such embodiments, the outgoing data includes the measured value. In embodiments, the outgoing data includes data identifying the gate drive unit. In some embodiments, the incoming data includes a read address for operational data to be included in the outgoing data. The incoming data also may include a write address for updating an operational parameter of the gate drive unit. The incoming data may include an updated setpoint of gate voltage. The incoming data may include an updated value for a duration of the blanking period. In some embodiments, the incoming data may include an expected value of data identifying the gate drive unit.

In another embodiment, a power converter includes a plurality of semiconductor power switches and a plurality of gate drive units connected to deliver gate voltage to the plurality of semiconductor power switches. Each gate drive unit includes a command link for connecting that gate drive unit in communication with a controller. Each gate drive unit is configured to receive a command signal from the controller via the command link. At least one gate drive unit is configured to detect a change of state of the command signal, to initiate a blanking period responsive to the change of state of the command signal, and within the blanking period, to process as incoming data any further changes of state of the command signal.

As will be readily appreciated, in embodiments, at least one gate drive unit may be configured to transmit outgoing data to the controller via the command link within the blanking period. In embodiments, the outgoing data is transmitted via modulation of a feedback signal. In embodiments, the outgoing data may include a measured value of at least one parameter of the semiconductor power switch to which the at least one of the gate drive units is connected. In certain embodiments, the outgoing data may include data identifying the gate drive unit. In some embodiments, the incoming data may include a read address for operational data to be included in the outgoing data. The incoming data also may include a write address for updating an operational parameter of the gate drive unit. In certain embodiments, the incoming data may include an updated setpoint of gate voltage. The incoming data may include an updated value for duration of the blanking period. In select embodiments, the incoming data may include an expected value of data identifying the gate drive unit.

Thus, according to embodiments of the present invention, it is possible to transmit data signals to and from a gate drive unit in addition to and on the same link as used for ON-OFF command signals. Data transmission on the same link used for commands, enables real time monitoring of gate drive units while they are operating, without increasing expense by added optical or electrical connections. Combined transmission of data, along with commands, also enables real time reconfiguration of gate drive units while they are operating. As the inventive communication protocol, method, and devices enable real-time health monitoring and reconfiguration of individual gate drive units within an operating power converter, the invention thereby enhances operational availability. As a result, overall costs of operation are reduced. Additionally, by enabling real time health monitoring, the communication protocol mitigates a conventional need for scheduled downtime to take maintenance measurements or change out apparatus/modules based on design life. Instead, the inventive communication protocol enables switch apparatus/module change out based on real time monitoring of module health, as further discussed in co-pending and commonly assigned application Ser. No. 11/809,965, which is hereby incorporated by reference in its entirety.

Another embodiment relates to a communication method. The method comprises detecting at a gate drive unit a change of state of a command signal that is received via a command link of the gate drive unit. The gate drive unit may be connected to, for example, a semiconductor power switch, in an inverter or other power converter. The change of state of the command signal is an electrical signal waveform configured in a designated manner for activating and/or deactivating the power switch to deliver current to a load (e.g., traction motor). The method further comprises initiating, responsive to the change of state of the command signal, a blanking period in which the gate drive unit will process as incoming data any further changes of state of the command signal. (The blanking period has a time duration, e.g., a static duration, or a duration that is determined based on operational conditions, or otherwise.) The method further comprises receiving incoming data at the gate drive unit, within the blanking period. In one embodiment, the data is received by processing modulations of the command signal. In another embodiment, the gate drive unit gets incoming data by way of another signal that is received at the gate drive unit during the blanking period. In embodiments, data is received at and/or transmitted from the gate drive unit only during blanking periods. (In other embodiments, data is received at the gate drive unit at other times, but blanking periods are the only time periods when received data might not also activate and/or deactivate the power switch for delivering current to a load.) In other embodiments, additionally or alternatively, once the time duration of a blanking period ends, the gate drive unit will return to responding to changes of state of the command signal (for activating and/or deactivating the power switch for delivering current to a traction motor or other load), until the next blanking period.

Another embodiment relates to a power switch apparatus. The power switch apparatus comprises a semiconductor power switch, a gate drive unit connected to the semiconductor power switch, and a command link (communication path) connecting the gate drive unit in communication with a controller. The gate drive unit is configured to receive a command signal from the controller via the command link. The gate drive unit is further configured to detect a designated change of state of the command signal. The gate drive unit is further configured to initiate a blanking period responsive to the designated change of state of the command signal. The gate drive unit is further configured to receive incoming data via the command link, within the blanking period. Generally, the change of state of the command signal is an electrical signal waveform configured in a designated manner for activating and/or deactivating the power switch to deliver current to a load (e.g., traction motor). The designated change of state might be, for example, the command signal transitioning from a designated HIGH voltage level to a designated LOW voltage level (or vice versa). As another example, the designated change of state might be the command signal transitioning from within a designated first threshold of the designated HIGH voltage level to within a designated second threshold of the designated LOW voltage level (or vice versa). In either case, the designated change of state may be based on pre-designated conditions of the command signal remaining at the transitioned-to voltage level for a certain time period, that is, the gate drive unit is aware that the command signal waveform will transition from first level to a different, second level, and remain at the second level for the time period, which is of a duration sufficient to accommodate transmission of data to/from the gate drive unit during a blanking period. Blanking periods may be initiated upon every detection of the designated change of state, or upon detection of the designated change of state during other designated operational conditions. In embodiments, data is received at and/or transmitted from the gate drive unit only during blanking periods. (In other embodiments, data is received at the gate drive unit at times other than during blanking periods, but blanking periods are the only time periods when received data might not also activate and/or deactivate the power switch for delivering current to a load.) In other embodiments, additionally or alternatively, once the time of a blanking period ends, the gate drive unit will return to responding to changes of state of the command signal, until the next blanking period.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above described communication protocol and method of data transfer, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A communication method comprising:
   detecting at a gate drive unit a change of state of a command signal that is received via a command link of the gate drive unit;
   initiating, responsive to the change of state of the command signal, a blanking period in which the gate drive unit will process as incoming data at least one further change of state of the command signal; and
   receiving incoming data at the gate drive unit, by processing modulations of the command signal, within the blanking period.

2. The communication method as claimed in claim 1, further comprising transmitting outgoing data from the gate drive unit via the command link, within the blanking period, by modulation of a feedback signal.

3. The communication method as claimed in claim 2, wherein the outgoing data is prepared by storing measured values in a memory.

4. The communication method as claimed in claim 2, wherein the outgoing data includes data identifying the gate drive unit.

5. The communication method as claimed in claim 2, wherein the incoming data includes a read address for selecting operational data to be included in the outgoing data.

6. The communication method as claimed in claim 1, wherein the incoming data includes a write address for updating an operational parameter of the gate drive unit.

7. The communication method as claimed in claim 1, wherein the incoming data includes an updated setpoint of gate drive voltage.

8. The communication method as claimed in claim 1, wherein the incoming data includes an updated value for a duration of the blanking period.

9. The communication method as claimed in claim 1, wherein the incoming data includes an expected value of data identifying the gate drive unit.

10. A power switch apparatus comprising:
    a semiconductor power switch;
    a gate drive unit connected to the semiconductor power switch;
    a command link connecting the gate drive unit in communication with a controller;
    wherein the gate drive unit is configured to receive a command signal from the controller via the command link, to detect a change of state of the command signal, to initiate, responsive to the change of state of the command signal, a blanking period in which the gate drive unit will process as incoming data at least one further change of state of the command signal, and to receive incoming data via the command link, within the blanking period.

11. The power switch apparatus as claimed in claim 10, wherein the gate drive unit is further configured to transmit outgoing data to the controller via the command link, within the blanking period.

12. The power switch apparatus as claimed in claim 11, wherein the outgoing data is transmitted via modulation of a feedback signal.

13. The power switch apparatus as claimed in claim 11, further comprising a sensor apparatus configured to measure a value of at least one characteristic of the semiconductor power switch, the outgoing data including the measured value.

14. The power switch apparatus as claimed in claim 11, wherein the outgoing data includes data identifying the gate drive unit.

15. The power switch apparatus as claimed in claim 11, wherein the incoming data includes a read address for operational data to be included in the outgoing data.

16. The power switch apparatus as claimed in claim 10, wherein the incoming data includes a write address for updating an operational parameter of the gate drive unit.

17. The power switch apparatus as claimed in claim 10, wherein the incoming data includes an updated setpoint of gate drive voltage.

18. The power switch apparatus as claimed in claim 10, wherein the incoming data includes an updated value for duration of the blanking period.

19. The power switch apparatus as claimed in claim 10, wherein the incoming data includes an expected value of data identifying the gate drive unit.

20. A power converter comprising:
    a plurality of semiconductor power switches;
    a plurality of gate drive units connected to deliver gate voltages to the plurality of semiconductor power switches, each gate drive unit including a command link for connecting that gate drive unit in communication with a controller, and each gate drive unit configured to receive a command signal from the controller via the command link;
    wherein at least one of the gate drive units is configured to detect a change of state of the command signal, to initiate a blanking period responsive to the change of state of the command signal, and, within the blanking period, to process as incoming data any further changes of state of the command signal.

21. The power converter as claimed in claim 20, wherein the at least one of the gate drive units is configured to transmit outgoing data to the controller via the command link within the blanking period.

22. The power converter as claimed in claim 21, wherein the outgoing data is transmitted via modulation of a feedback signal.

23. The power converter as claimed in claim 21, wherein the outgoing data includes a measured value of at least one parameter of the semiconductor power switch to which the at least one of the gate drive units is connected.

24. The power converter as claimed in claim 21, wherein the outgoing data includes data identifying the at least one of the gate drive units.

25. The power converter as claimed in claim 20, wherein the incoming data includes a read address for operational data to be included in the outgoing data.

26. The power converter as claimed in claim 20, wherein the incoming data includes a write address for updating an operational parameter of the at least one of the gate drive units.

27. The power converter as claimed in claim 20, wherein the incoming data includes an updated setpoint of gate drive voltage.

28. The power converter as claimed in claim 20, wherein the incoming data includes an updated value for duration of the blanking period.

29. The power converter as claimed in claim 20, wherein the incoming data includes an expected value of data identifying the at least one of the gate drive units.

* * * * *